(12) United States Patent
Miwa et al.

(10) Patent No.: US 6,212,646 B1
(45) Date of Patent: Apr. 3, 2001

(54) MICROPROCESSOR INCLUDING FLASH MEMORY WITH ITS VERIFICATION SIMPLIFIED

(75) Inventors: Yuichiro Miwa; Katsunobu Hongo, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/084,506

(22) Filed: May 27, 1998

(30) Foreign Application Priority Data

Jan. 7, 1998 (JP) .................................................. 10-001917

(51) Int. Cl.⁷ ..................................................... G06F 1/04
(52) U.S. Cl. ........................... 713/601; 713/502; 711/103
(58) Field of Search ..................................... 713/500, 501, 713/502, 503, 600, 601; 711/103, 1; 714/42

(56) References Cited

U.S. PATENT DOCUMENTS

| | | | | |
|---|---|---|---|---|
| 5,287,469 | * | 2/1994 | Tsuboi .................................. | 711/103 |
| 5,295,255 | * | 3/1994 | Malecek et al. .......................... | 711/1 |
| 5,355,464 | * | 10/1994 | Fandrich et al. ...................... | 365/218 |
| 5,509,134 | * | 4/1996 | Fandrich et al. ...................... | 711/103 |
| 5,657,467 | * | 8/1997 | Hasegawa ............................. | 711/103 |
| 5,687,345 | * | 11/1997 | Matsubara et al. ................... | 711/103 |
| 5,724,289 | * | 3/1998 | Watanabe .............................. | 365/201 |
| 5,805,501 | * | 9/1998 | Shiau et al. ...................... | 365/185.29 |
| 5,838,614 | * | 11/1998 | Estakhri et al. ................. | 365/185.11 |
| 5,923,838 | * | 7/1999 | Hongo ..................................... | 714/42 |
| 5,950,222 | * | 9/1999 | Yamada et al. ...................... | 711/103 |
| 6,032,221 | * | 2/2000 | Hongo .................................. | 711/103 |

FOREIGN PATENT DOCUMENTS 63-206852   8/1988   (JP) .
8-273383   10/1996   (JP) .

* cited by examiner

*Primary Examiner*—Tuan V. Thai
*Assistant Examiner*—Brian R. Peugh
(74) *Attorney, Agent, or Firm*—Burns, Doane, Swecker & Mathis, LLP

(57) ABSTRACT

A microcomputer including a flash memory and a CPU for carrying out verification of data written into the flash memory. A flash controller suspends the supply of a clock signal to the CPU when it receives a verification command from the CPU, establishes a verification condition, and reads data from the flash memory. After reading the data from the flash memory, it restarts the supply of the clock signal to the CPU so that the CPU receives the data. This makes it unnecessary for a program of the CPU for writing data into the flash memory to be transferred from the flash memory to a RAM, enabling the structure of the program to be simplified.

23 Claims, 11 Drawing Sheets

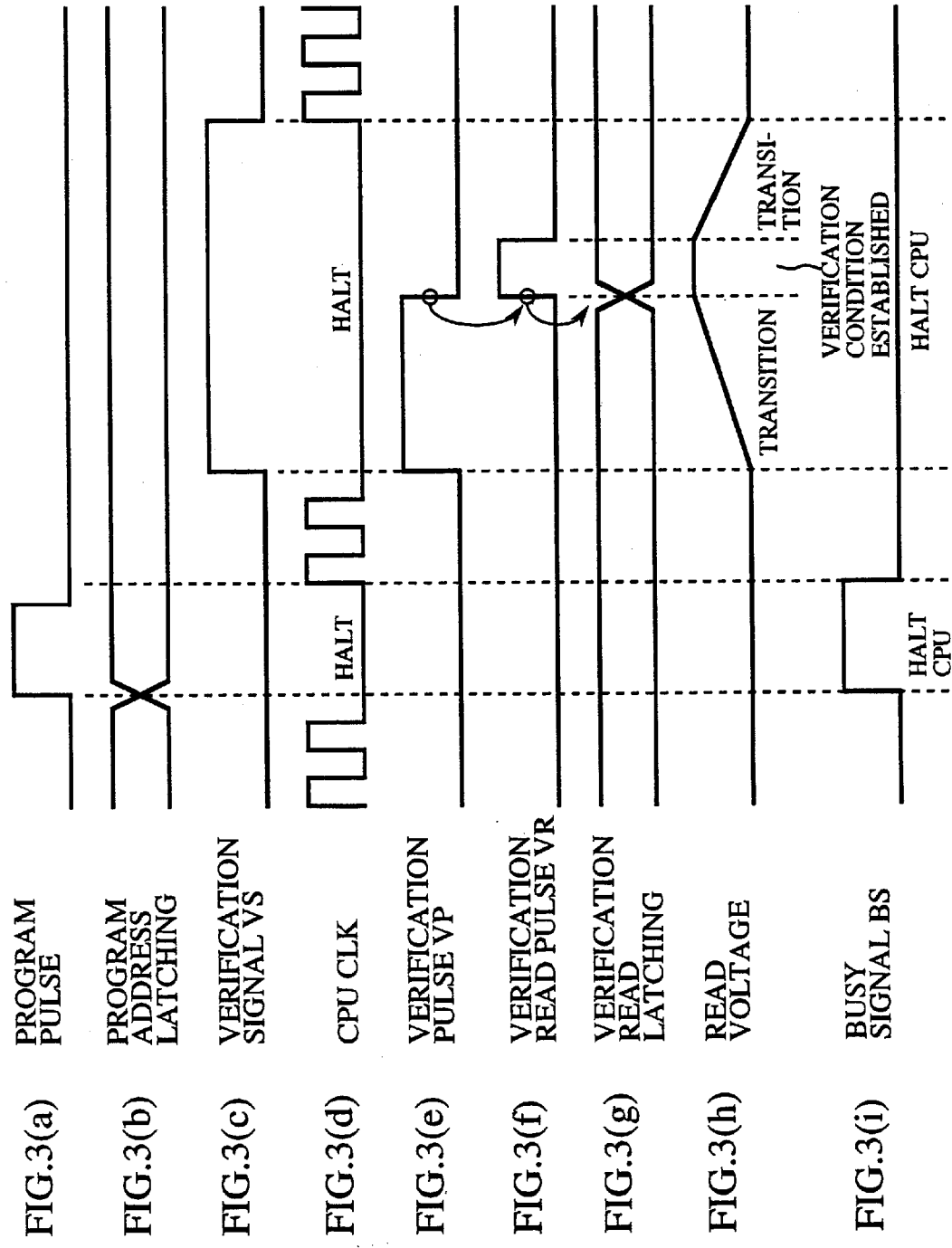

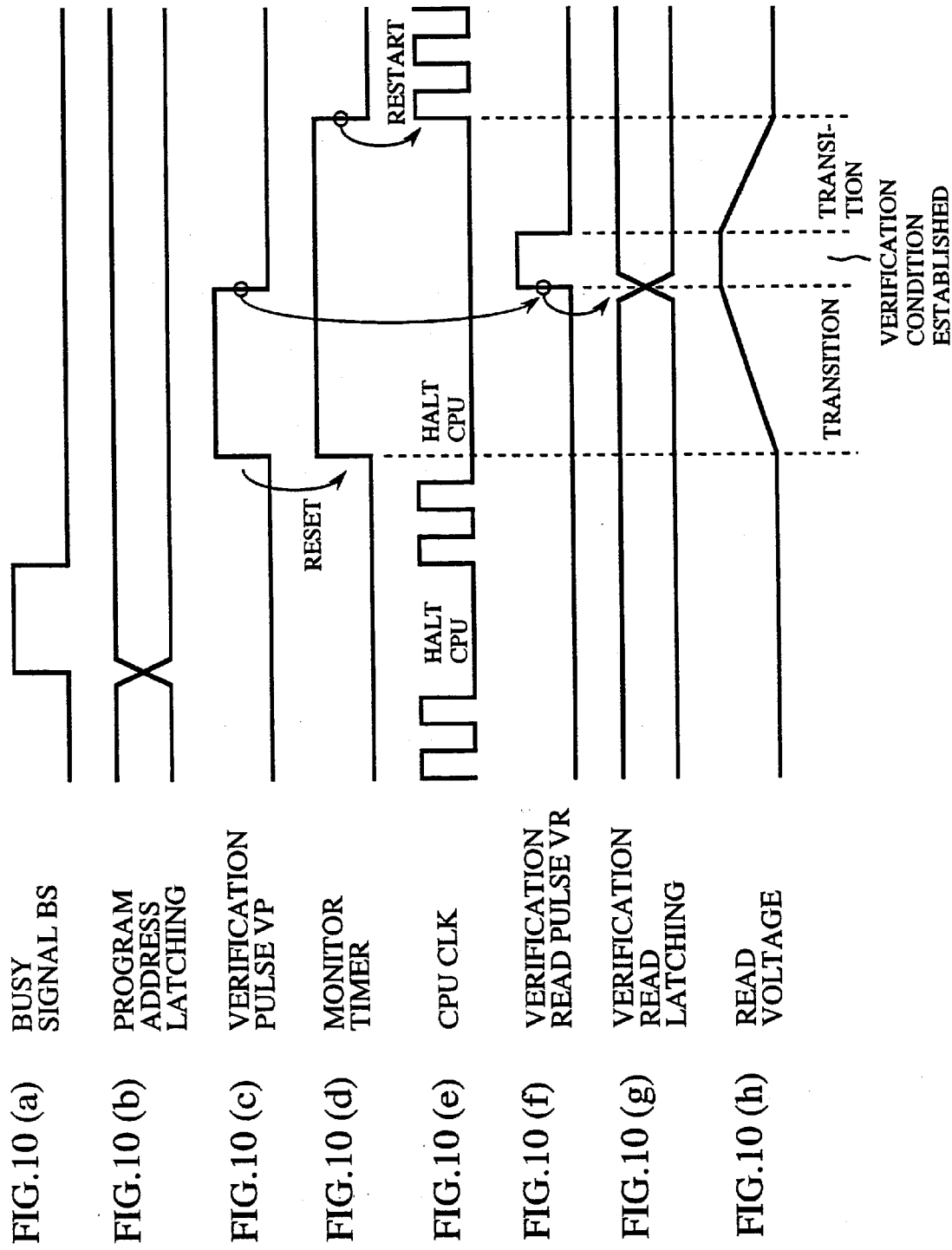

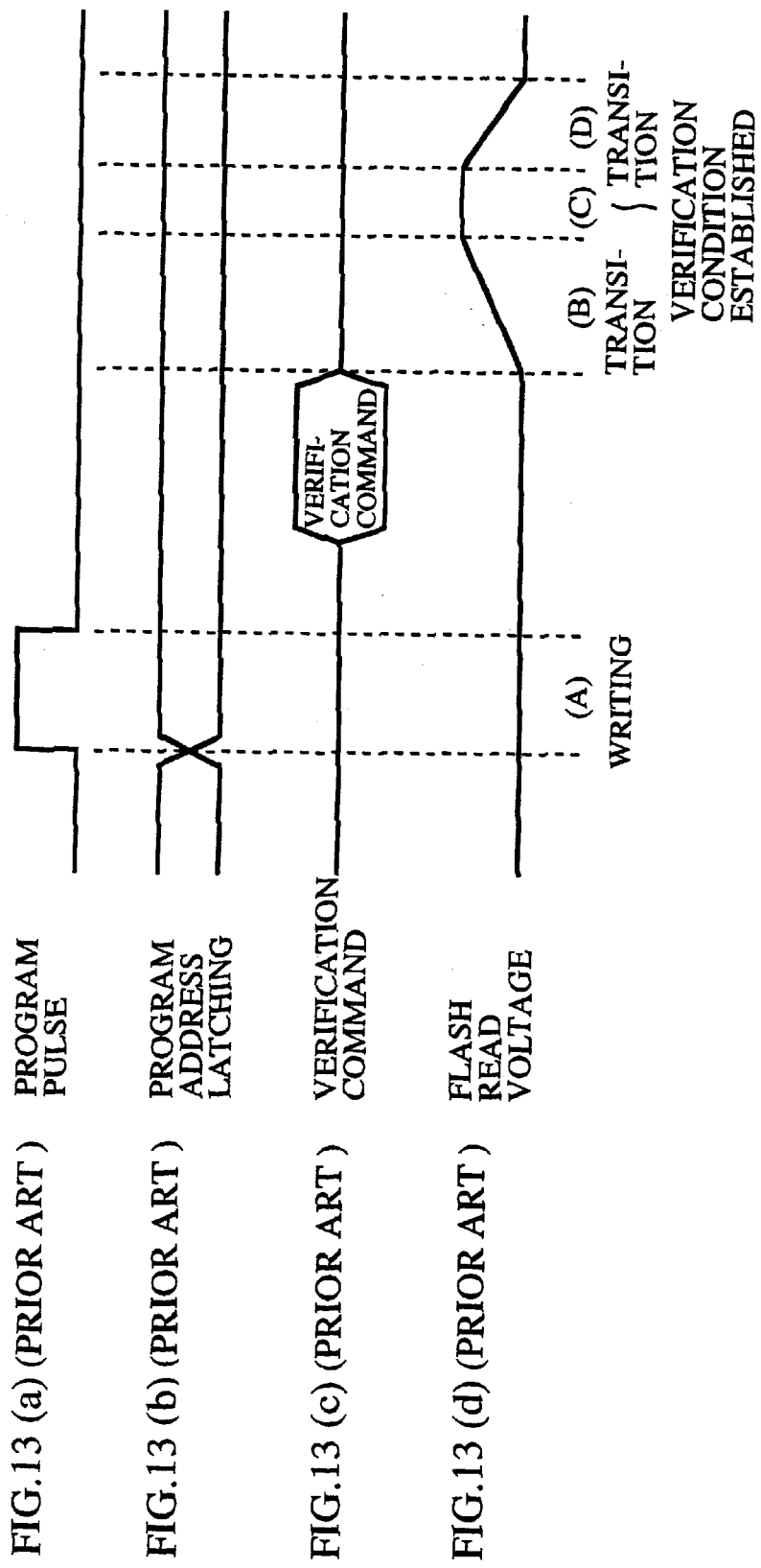
FIG.13 (a) (PRIOR ART) PROGRAM PULSE
FIG.13 (b) (PRIOR ART) PROGRAM ADDRESS LATCHING
FIG.13 (c) (PRIOR ART) VERIFICATION COMMAND
FIG.13 (d) (PRIOR ART) FLASH READ VOLTAGE

MICROPROCESSOR INCLUDING FLASH MEMORY WITH ITS VERIFICATION SIMPLIFIED

BACKGROUND OF THE INVENTION

1. Field of the Invention

The present invention relates to a microcomputer with a function of writing data to an embedded flash memory and a function of erasing data therefrom.

2. Description of Related Art

FIG. 11 is a block diagram showing a conventional microcomputer, in which the reference numeral 1 designates an oscillator; 2 and 3 designate a port for connecting the oscillator 1; 4 designates a clock generator for generating clock signals CLK; 5 designates peripheral devices like A/D converters; 6 designates a monitor timer that counts one of the clock signals generated by the clock generator 4, and produces an overflow signal OF when the count value reaches a set value without being reset; 7 designates an interrupt controller for generating an interrupt signal INT to a CPU 12 when the overflow signal OF is produced from the monitor timer 6; 8 designates a personal computer that transmits data to be written into a flash memory 14; 9 designates an interface connected between the personal computer 8 and the microcomputer for receiving and transmitting data between them; and 10 designates a port for connecting the interface 9 to the microcomputer.

The reference numeral 11 designates a RAM in which a program stored in the flash memory 14 is temporarily stored when the CPU 12 writes in the flash memory 14 data transferred from the personal computer 8; 12 designates the CPU that executes programs in response to one of the clock signals generated by the clock generator 4, and carries out, when writing data in the flash memory 14, verification of the written data; 13 designates a flash controller that carries out writing of the data sent from the personal computer 8 into the flash memory 14, and establishes a verification condition by increasing voltages of a sense amplifier and decoder when the CPU 12 issues a verification command; and 14 designates the flash memory for storing programs executed by the CPU 12 and the data transmitted from the personal computer 8.

FIG. 12 is a block diagram showing the detail of the flash controller 13. In FIG. 12, the reference numeral 21 designates a control register that supplies, when a bit "1" is written into it by the CPU 12, a controller 23 with a mode designation signal M indicative of changing the mode of the microcomputer to a data write mode; 22 designates a command register that receives a command sent from the CPU 12 and transfers the command CM to the controller 23; and 23 designates the controller that controls writing in the flash memory 14 the data transmitted from the personal computer 8 when the command register 22 outputs the write command, and establishes the verification condition by increasing the voltages of the sense amplifier and decoder from normal voltages when the CPU 12 outputs the verification command.

Next, the operation of the conventional microcomputer will be described with reference to the timing charts of FIGS. 13(a)–13(d) illustrating the operation of the conventional microcomputer, and to the flowchart of FIG. 14 illustrating it.

First, the CPU 12 executes programs in response to one of the clock signals generated by the clock generator 4. In the course of this, the monitor timer 6, which is provided in preparation for the runaway of the CPU 12 due to a fault of the microcomputer or the like, counts the clock signal, and, outputs the overflow signal OF if the count value reaches the set value without being reset, in which case, the interrupt controller 7 generates the interrupt signal INT to the CPU 12.

When the CPU 12 executes a program stored in the flash memory 14, and if the program contains a data write operation into the flash memory 14, which involves the verification, the CPU 12 transfers the program from the flash memory 14 to the RAM 11 at step ST1 before execution, the reason for which will be described later.

Having transferred the program to the RAM 11, the CPU 12 operates in accordance with the program. When writing data into the flash memory 14, the CPU 12 writes "1" into the control register 21 in the flash controller 13 to have the control register 21 supply the controller 23 with the mode designation signal M so that the controller 23 can recognize that the mode of the microcomputer is shifted to the rewrite mode at step ST2.

Thus, the controller 23 in the flash controller 13 enters into a waiting state in which it accepts a command sent from the CPU 12. The CPU 12 transmits to the command register 22 in the flash controller 13 a command (40H, for example) instructing the controller 23 to write data at step ST3, and then transfers data sent from the personal computer 8 to the controller 23 in the flash controller 13.

Receiving the command from the command register 22 and the data transferred from the personal computer 8, the controller 23 in the flash controller 13 supplies the flash memory 14 with a flash control signal F indicative of the data write, and writes the data into the flash memory 14 as illustrated at position (A) of FIGS. 13(a)–13(d).

When the data has been written into the flash memory 14 in this way, the controller 23 in the flash controller 13 writes "0" in the control register 21 which is kept "1" during the data write operation. The CPU 12 monitors the value stored in the control register 21, and makes a decision whether the data write has been completed or not at steps ST4 and ST5.

Detecting that the value stored in the control register 21 of the flash controller 13 changes to "0", the CPU 12 transmits a verification command (COH, for example) to the command register 22 in the flash controller 13 at step ST6 to make a decision whether or not the data is written correctly into the flash memory 14.

Receiving the verification command from the command register 22, the controller 23 in the flash controller 13 establishes the verification condition by increasing the voltages of the sense amplifier and decoder from their normal voltages as shown at positions (B), (C) and (D) in FIG. 13(d).

These voltages are increased in the verification process to ensure that the data has been written correctly by making a decision whether the data is read correctly under the more strict conditions than usual.

It will now be clear from the foregoing description why the CPU 12 transfers the program to the RAM 11 before writing data into the flash memory 14. This is because once the verification condition has been established, the read condition of the data becomes severer than usual, which will make it difficult for the CPU 12 to read the program correctly, thereby hindering the normal operation.

When the verification condition has been established at step ST7, the CPU 12 reads the data from the flash memory 14, and makes a decision whether the data agrees with an expected value, that is, the data transferred from the personal computer 8. If they agree with each other, it decides that the data is written correctly at step ST8, and then proceeds to the next address at step ST9. On the other hand, if they disagree, it decides that the data is not written correctly at step ST8, and rewrites the data through steps ST3–ST8.

Since the conventional microcomputer has such a configuration, the CPU 12 must read the data from the flash memory 14 when the verification condition has been established. To achieve reading the data, the CPU 12 must read the program correctly at that time. However, since the read condition of the data in the verification condition is severer than usual, it is likely that the program cannot be read correctly from the flash memory 14. Thus, the program must be transferred from the flash memory 14 to the RAM 11 before writing data to the flash memory 14, which presents a problem of complicating the program structure. In addition, the RAM 11 must have a larger capacity by an amount needed for storing the transferred program.

SUMMARY OF THE INVENTION

The present invention is implemented to solve the foregoing problem. It is therefore an object of the present invention to provide a microcomputer capable of achieving the verification without transferring the program from the flash memory to the RAM.

According to a first aspect of the present invention, there is provided a microcomputer comprising: a flash memory; a clock generator for generating a clock signal; a CPU (central processing unit) for transmitting a verification command when carrying out verification of data in the flash memory while executing a program in response to the clock signal generated by the clock generator; condition establishing means for establishing, when it receives the verification command from the CPU, a verification condition by suspending supply of the clock signal to the CPU; data read means for reading data from the flash memory when the condition establishing means establishes the verification condition; comparing means for comparing the data read from the flash memory with an expected value; and condition releasing means for releasing the verification condition to restart the supply of the clock signal to the CPU.

Here, the data to be subjected to the verification may be data written into the flash memory.

The data to be subjected to the verification may be data left in the flash memory after erasure of the flash memory.

The data read means may comprise a register for storing the data read from the flash memory, and the comparing means may consist of the CPU that restarts its operation and compares the data in the register with the expected value after the condition releasing means releases the verification condition.

The comparing means may compare the data read by the data read means with the expected value when the verification condition is established, and the condition releasing means may release the verification condition when the comparing means outputs a compared result.

The microcomputer may further comprise a monitor timer for starting, when the CPU transmits the verification command, counting of a clock signal generated by the clock generator, and for producing an overflow signal when its count value reaches a set value without being reset.

The microcomputer may further comprise clock management means for resetting, when the CPU transmits the verification command, the count value of the monitor timer, for supplying the condition establishing means with a command to suspend supply of the clock signal to the CPU, and for supplying the condition releasing means with a command to restart the supply of the clock signal to the CPU when the monitor timer produces the overflow signal.

The clock management means may change at least one of a pulse rate of the clock signal and the set value of the monitor timer when the CPU transmits the verification command.

According to a second aspect of the present invention, there is provided a microcomputer comprising: a flash memory; a clock generator for generating a clock signal; a CPU (central processing unit) for transmitting a verification command when carrying out, while executing a program in response to the clock signal generated by the clock generator, verification of data in the flash memory generated by auto-erasure; condition establishing means for establishing, when it receives the verification command from the CPU, a verification condition by suspending supply of the clock signal to the CPU; data read means for reading data from the flash memory when the condition establishing means establishes the verification condition; decision means for making a decision whether the data read from the flash memory all agree with each other; and condition releasing means for releasing the verification condition to restart the supply of the clock signal to the CPU.

BRIEF DESCRIPTION OF THE DRAWINGS

FIGS. 3(*a*)–3(*i*) are timing charts illustrating the operation of the embodiment 1 of the microcomputer in accordance with the present invention;

FIGS. 10(*a*)–10(*h*) are timing charts illustrating the operation of the embodiment 9 of the microcomputer in accordance with the present invention;

FIGS. 13(*a*)–13(*d*) are timing charts illustrating the operation of the conventional microcomputer.

DETAILED DESCRIPTION OF THE PREFERRED EMBODIMENTS

The invention will now be described with reference to the accompanying drawings.

Embodiment 1

Figure 1:
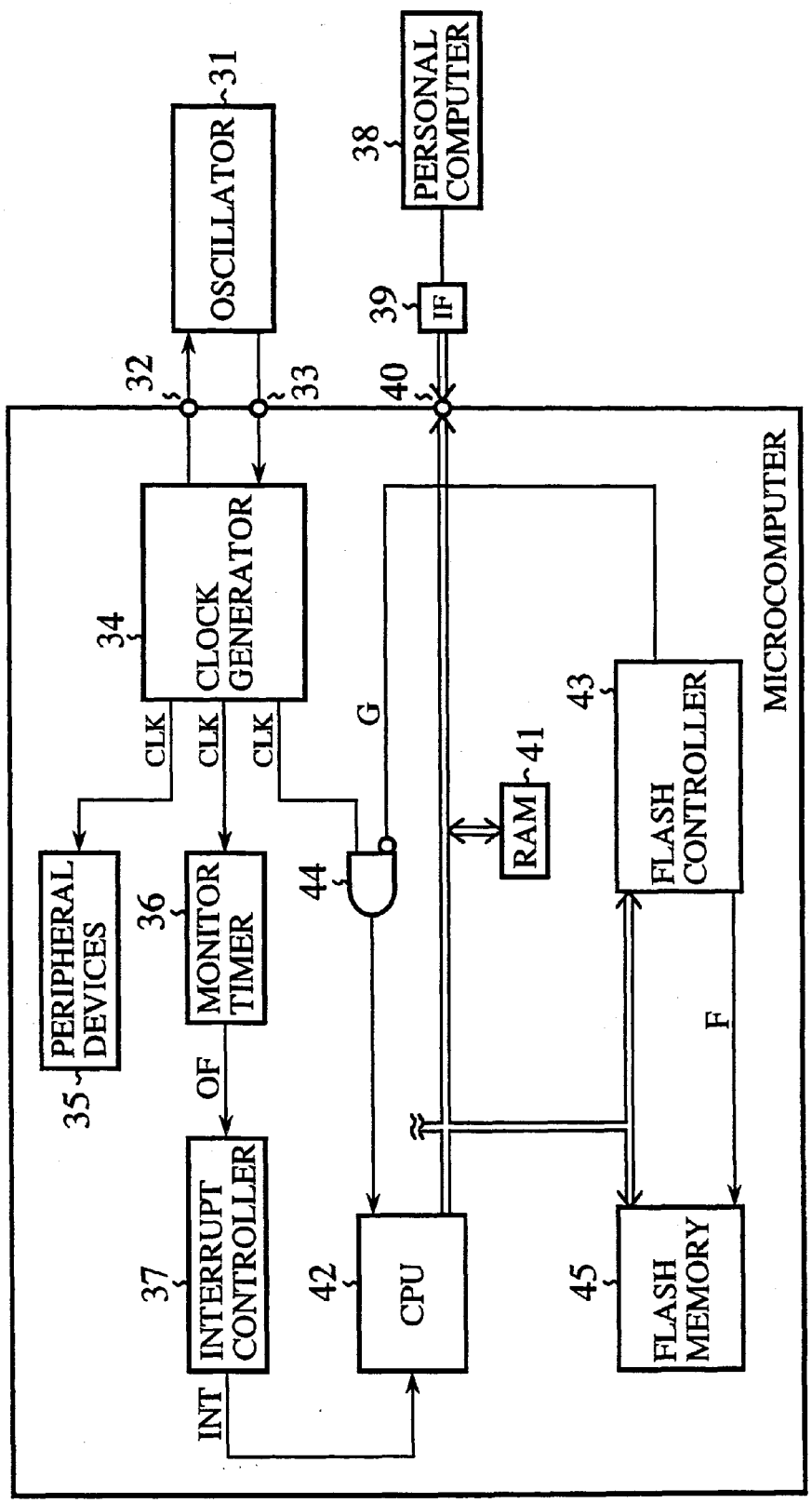
FIG. 1 is a block diagram showing an embodiment 1 of a microcomputer in accordance with the present invention.

FIG. 1 is a block diagram showing an embodiment 1 of a microcomputer in accordance with the present invention. In FIG. 1, the reference numeral 31 designates an oscillator; 32 and 33 designate a port for connecting the oscillator 31; 34 designates a clock generator for generating clock signals CLK; 35 designates peripheral devices like A/D converters; 36 designates a monitor timer that counts one of the clock signals generated by the clock generator 34, and produces an overflow signal OF when the count value reaches a set value without being reset; 37 designates an interrupt controller for generating an interrupt signal INT to a CPU 42 when the overflow signal OF is produced from the monitor timer 36; 38 designates a personal computer that transmits data to be written into a flash memory 45; 39 designates an interface connected between the personal computer 38 and the microcomputer for receiving and transmitting data between them; and 40 designates a port for connecting the interface 39 to the microcomputer.

The reference numeral 41 designates a RAM; and 42 designates the CPU that executes programs in response to one of the clock signals generated by the clock generator 34. The CPU 42 transmits a verification command when carrying out the verification of data written in the flash memory 45, and compares the data with an expected value, when the data is read from the flash memory 45 and is stored in a register of a flash controller 43. The reference numeral 43 designates a flash controller (condition establishing means, data read means and condition releasing means) for generating, when receiving the verification command from the CPU 42, a gate control signal G of an H level indicative of suspending supply of the clock signal to the CPU 42. Besides, the flash controller 43 has a function of reading the data from the flash memory 45 after establishing the verification condition, a function of releasing, when having read the data from the flash memory 45, the verification condition, and outputs the gate control signal G of an L level indicative of restarting the clock signal to the CPU 42. The reference numeral 44 designates an AND gate (condition establishing means and condition releasing means) for controlling the supply of the clock signal to the CPU 42 in response to the gate control signal G produced from the flash controller 43; and 45 designates the flash memory for storing programs executed by the CPU 42 and the data transmitted from the personal computer 38.

Figure 2:
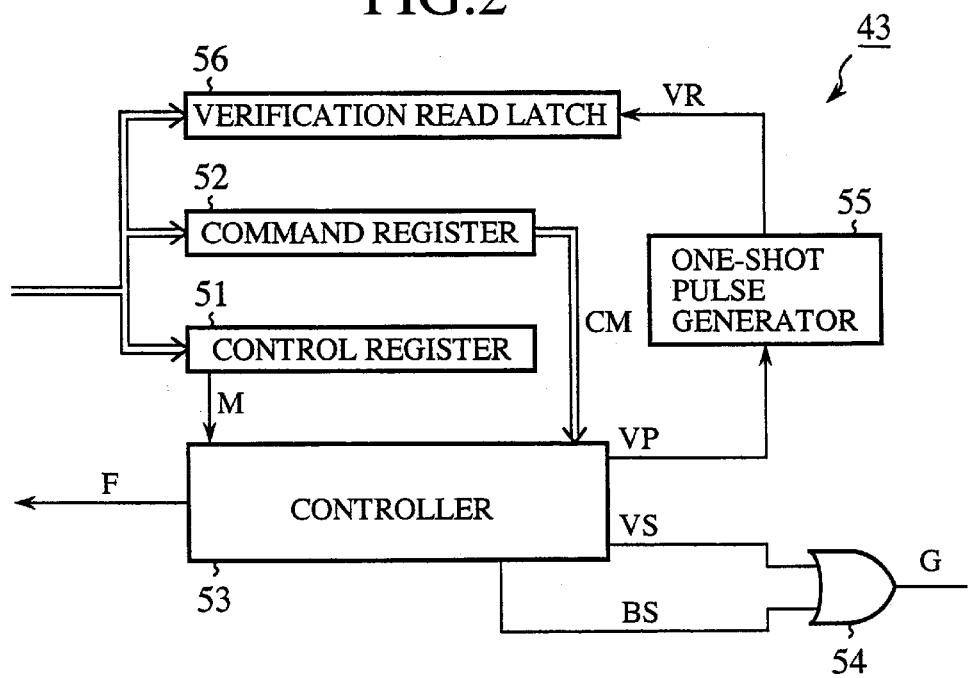
FIG. 2 is a block diagram showing the detail of a flash controller 43 of the embodiment 1.

FIG. 2 is a block diagram showing the detail of the flash controller 43. In FIG. 2, the reference numeral 51 designates a control register that supplies, when a bit value "1" is written into it by the CPU 42, a controller 53 with a mode designation signal M indicative of changing the mode of the microcomputer to a data write mode; 52 designates a command register that receives a command sent from the CPU 42 and supplies the command CM to the controller 53; and 53 designates the controller that writes in the flash memory 45 the data the CPU 42 receives from the personal computer 38 when the command register 52 outputs the write command, and establishes the verification condition by increasing the voltages of the sense amplifier and decoder from their normal voltages when the CPU 42 outputs the verification command.

The reference numeral 54 designates an OR gate that outputs the gate control signal G of the H level as long as the controller 53 outputs a busy signal BS or a verification signal VS. Here, the controller 53 outputs the busy signal BS during writing data, and the verification signal VS from the start of establishing the verification condition to the release thereof. The reference numeral 55 designates a one-shot pulse generator that outputs a verification read pulse VR instructing the verification read latch 56 to read the data from the flash memory 45 when the controller 53 produces a verification pulse VP which falls from the H to L level when the verification condition has been established; and 56 designates a verification read latch (register) that reads the data from the flash memory 45, and stores the data when the one-shot pulse generator 55 outputs the verification read pulse VR.

Figure 4:
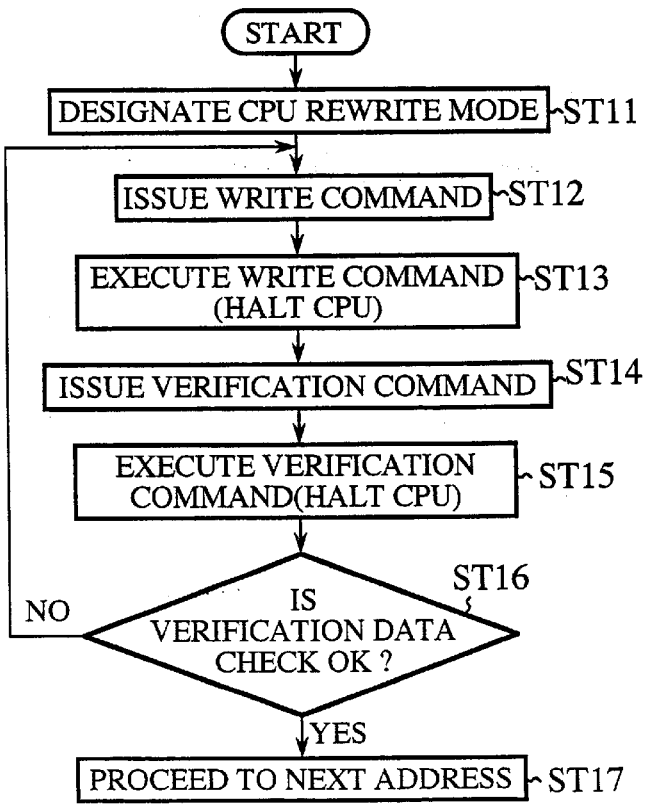
FIG. 4 is a flowchart illustrating the operation of the embodiment 1 of the microcomputer in accordance with the present invention.

Next, the operation of the present embodiment 1 will be described with reference to the timing charts of FIGS. 3(a)–3(i) illustrating the operation of the embodiment 1 of the microcomputer, and the flowchart of FIG. 4 illustrating it.

First, the CPU 42 executes programs in response to one of the clock signals generated by the clock generator 34. In the course of this, the monitor timer 36, which is provided in preparation for the runaway of the CPU 42 due to a fault of the microcomputer or the like, counts the clock signal, and outputs the overflow signal OF if the count value reaches the set value without being reset, in which case, the interrupt controller 37 generates the interrupt signal INT to the CPU 42.

The CPU 42 executes processings in accordance with a program stored in the flash memory 45. When the program contains a data write operation into the flash memory 45, the CPU 42 writes "1" into the control register 51 in the flash controller 43 to have the control register 51 supply the controller 53 with the mode designation signal M so that the controller 53 can recognize that the mode of the microcomputer is changed to the rewrite mode at step ST11.

Thus, the controller 53 in the flash controller 43 enters into a waiting state in which it accepts a command sent from the CPU 42. The CPU 42 transmits to the command register 52 in the flash controller 43 a command (40H, for example) instructing the controller 53 to write data at step ST12, and then transfers data sent from the personal computer 38 to the controller 53 in the flash controller 43.

Receiving the command CM from the command register 52 and the data transferred from the personal computer 38, the controller 53 in the flash controller 43 supplies the flash memory 45 with a flash control signal F indicative of the data write, and writes the data into the flash memory 45 at step ST13.

While writing the data into the flash memory 45, the controller 53 in the flash controller 43 supplies the OR gate 54 with the busy signal BS so that the OR gate 54 outputs the gate control signal G of the H level.

Accordingly, the AND gate 44 blocks the clock signal to be supplied from the clock generator 34 to the CPU 42, thereby suspending the operation of the CPU 42 as illustrated FIG. 3(d).

In this way, the data is written into the flash memory 45. When the data write has been completed, the controller 53 in the flash controller 43 halts the busy signal BS so that the OR gate 54 supplies the AND gate 44 with the gate control signal G of the H level. Thus, the CPU 42 restarts its operation as illustrated in FIG. 3(d).

Afterward, the CPU 42 transmits a verification command (COH, for example) to the command register 52 in the flash controller 43 at step ST14 to make a decision whether or not the data is written correctly into the flash memory 45.

Receiving the verification command from the command register 52, the controller 53 in the flash controller 43 supplies the OR gate 54 with the verification signal VS of the H level, which is output therefrom as the gate control signal G of the H level.

Thus, the AND gate 44 blocks the clock signal to be supplied from the clock generator 34 to the CPU 42, thereby suspending the operation of the CPU 42 as illustrated in FIG. 3(d).

Then, the controller 53 in the flash controller 43 establishes the verification condition by increasing the voltages of the sense amplifier and decoder from their normal voltages as shown in FIG. 3(h).

These voltages are increased in the verification process to ensure that the data is written securely by confirming whether the data can be read correctly under more strict conditions than usual.

When the verification condition has been established, the controller 53 in the flash controller 43 supplies the one-shot pulse generator 55 with the verification pulse which indicates the establishment by falling from the H to L level. In response to this, the one-shot pulse generator 55 supplies the verification read latch 56 with the verification read pulse VR instructing it to read the data from the flash memory 45. Thus, the verification read latch 56 reads the data from the flash memory 45 at step ST15.

When the verification read latch 56 completes reading the data, the controller 53 in the flash controller 43 releases the verification condition, and supplies the OR gate 54 with the verification signal VS of the L level after the release. Thus, the OR gate 54 outputs the gate control signal G of the L level, and the AND gate 44 releases the block of the clock signal, thereby restarting the supply of the clock signal to the CPU 42 to restart it as illustrated in FIG. 3(d).

Restarting its operation, the CPU 42 reads from the verification read latch 56 in the flash controller 43 the data which have been read from the flash memory 45, and makes a decision whether the data agrees with an expected value, that is, the data transferred from the personal computer 38. If they agree with each other, it decides that the data is written correctly at step ST16, and proceeds to the next address at step ST17. On the other hand, if they disagree, it decides that the data is not written correctly at step ST16, and rewrites the data through steps ST12–ST16.

As described above, the present embodiment 1 prevents, when the CPU 42 issues the verification command, the clock signal from being supplied to the CPU 42, establishes the verification condition, and reads the data from the flash memory 45; and then restarts, when the data read has been completed, to supply the clock signal to the CPU 42, so that the CPU 42 receives the data. This makes it unnecessary for the CPU 42 to read the data from the flash memory 45 when the verification condition is established. As a result, even if the flash memory 45 stores the program to be executed by the CPU 42, it is not necessary to transfer the program from the flash memory 45 to the RAM 41 to achieve the verification.

Embodiment 2

Although the verification is carried out on the data written into the flash memory 45 in the foregoing embodiment 1, it can be carried out with the data left in the flash memory 45 after its erasure, achieving a similar same effect to that in the embodiment 1.

Specifically, the CPU 42 supplies the command register 52 in the flash controller 43 with a command instructing the controller 53 to erase data in the flash memory 45 in place of the command instructing it to write data thereinto, so that the data is erased.

The verification of the data erasure is carried out as in the embodiment 1 by reading the data from the flash memory 45 to the verification read latch 56, and by confirming that the data in the verification read latch 56 is "FFH".

Embodiment 3

Although the verification is carried out on the data written in the flash memory 45 in the foregoing embodiment 1, it can be performed on the data written into the flash memory 45 by auto-erasure. In this case, the verification can be achieved by confirming whether the data read out of the flash memory 45 are all agree with each other, and by making a decision that the data are written correctly by the auto-erasure if they agree entirely. Thus, the present embodiment 3 can achieve the effect similar to that of the embodiment 1.

Embodiment 4

Although the verification is carried out on the data left in the flash memory 45 after its erasure in the foregoing embodiment 2, it can be performed on the data left in the flash memory 45 after its auto-erasure. In this case, the verification can be achieved by confirming whether the data read out of the flash memory 45 all agree with each other, and by making a decision that the data are erased correctly by the auto-erasure if they agree entirely. Thus, the present embodiment 4 can achieve the effect similar to that of the embodiment 2.

Embodiment 5

Figure 5:
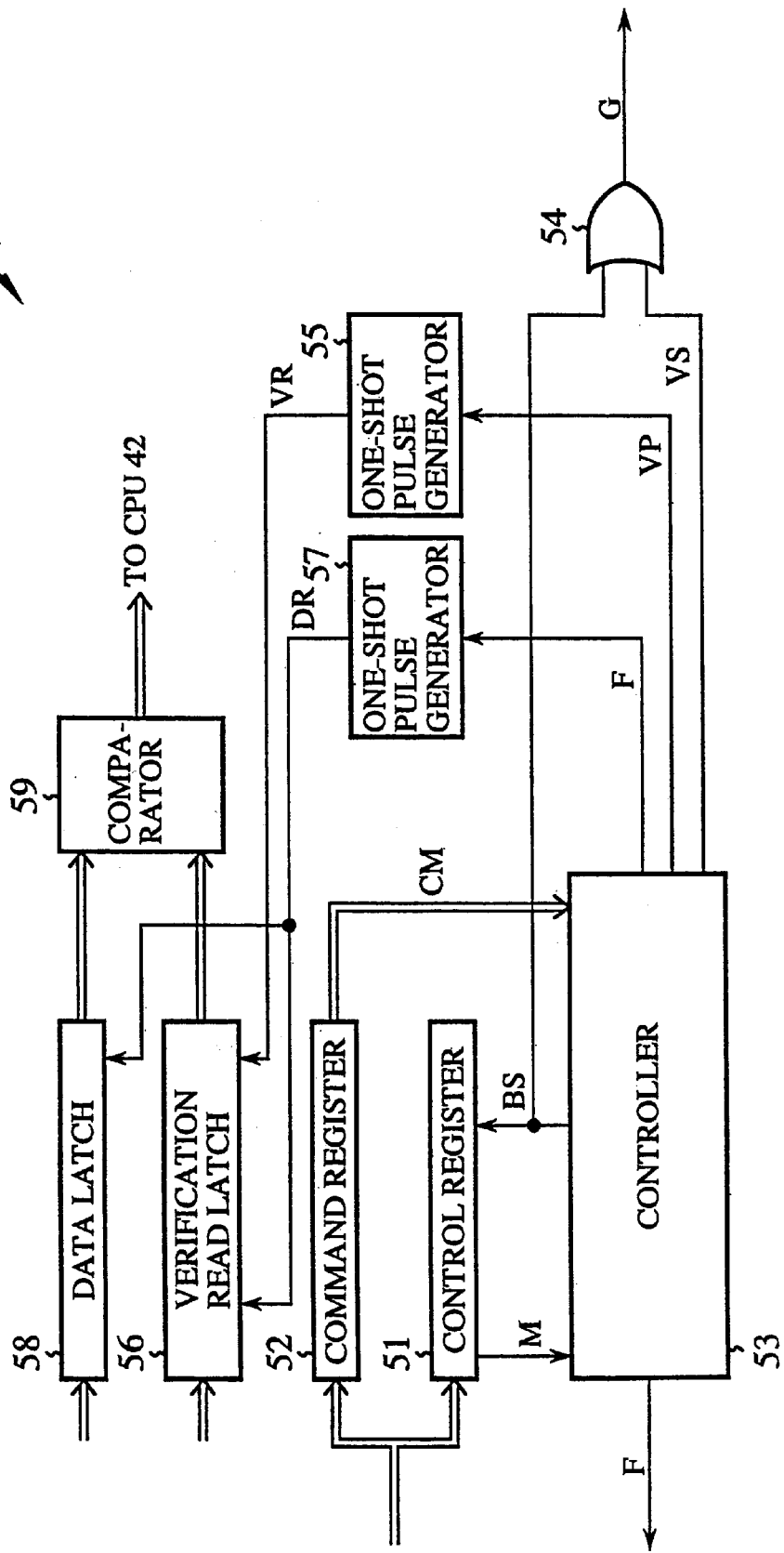
FIG. 5 is a block diagram showing the detail of a flash controller 43 of an embodiment 5 of the microcomputer in accordance with the present invention.

FIG. 5 is a block diagram showing the detail of the flash controller 43 of an embodiment 5 of the microcomputer in accordance with the present invention. In FIG. 5, the same reference numerals as those of FIG. 2 designate the corresponding portions, and the description thereof will be omitted here.

The reference numeral 57 designates a one-shot pulse generator that produces, when the controller 53 outputs the flash control signal F for writing data into the flash memory 45, a data read pulse DR instructing a data latch 58 to store the data to be written into the flash memory 45; 58 designates the data latch for storing the data to be written into the flash memory 45 when the one-shot pulse generator 57 outputs the data read pulse DR; and 59 designates a comparator that compares, when the verification read latch 56 stores the data at the time the verification condition has been established, that data with the data stored in the data latch 58, and supplies the compared result to the CPU 42 through a bus.

Figure 6:
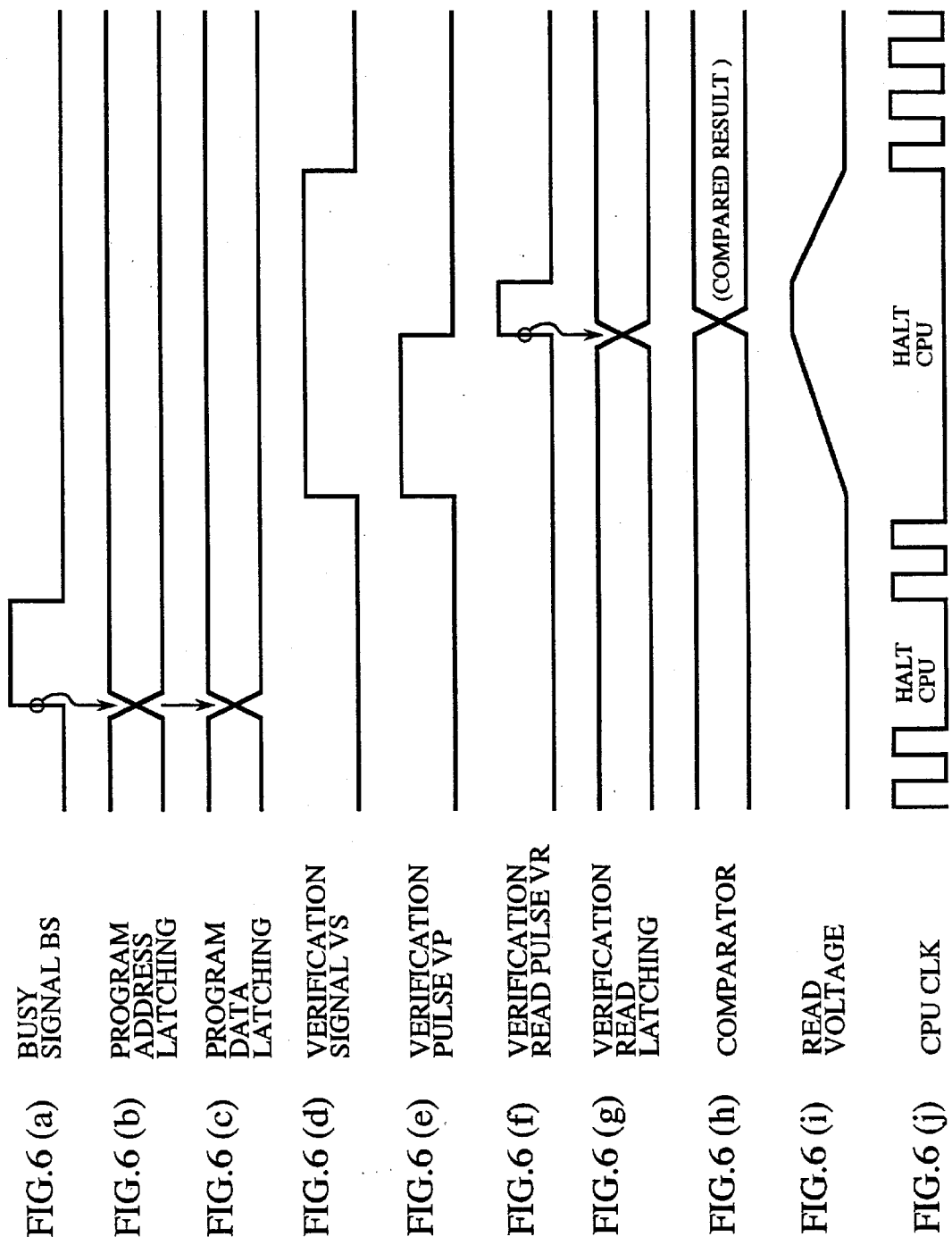
FIGS. 6(*a*)–6(*j*) are timing charts illustrating the operation of the embodiment 5 of the microcomputer in accordance with the present invention.
Figure 7:
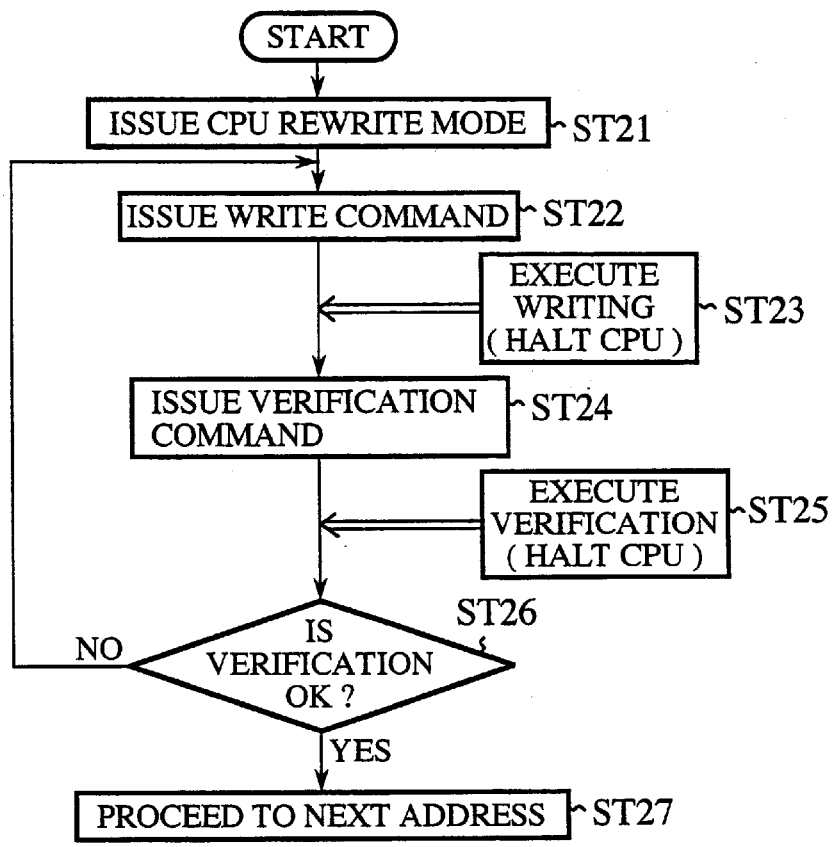
FIG. 7 is a flowchart illustrating the operation of the embodiment 5 of the microcomputer in accordance with the present invention.

Next, the operation of the present embodiment 5 will be described with reference to the timing charts of FIGS. 6(a)–6(j) illustrating the operation of the embodiment 5 of the microcomputer in accordance with the present invention, and to the flowchart of FIG. 7 illustrating it.

First, when the CPU 42 executes the data write operation into the flash memory 45, the CPU 42 writes "1" into the control register 51 in the flash controller 43 as in the embodiment 1 to have the control register 51 supply the controller 53 with the mode designation signal M so that the controller 53 can recognize that the mode of the microcomputer is changed to the rewrite mode of the data at step ST21.

Thus, the controller 53 in the flash controller 43 enters into the waiting state in which it accepts a command sent from the CPU 42. The CPU 42 transmits to the command register 52 in the flash controller 43 a command (40H, for example) instructing the controller 53 to write data at step ST22, and then receives data sent from the personal computer 38 and transfers it to the controller 53 in the flash controller 43.

Receiving the command CM from the command register 52 and the data transferred from the personal computer 38, the controller 53 in the flash controller 43 supplies the flash memory 45 with a flash control signal F indicative of the data write, and writes the data into the flash memory 45 at step ST23. Besides, the controller 53 supplies the flash control signal F to the one-shot pulse generator 57 to have the data latch 58 store the data to be written into the flash memory 45 in preparation for the verification carried out at the subsequent stage. Thus, the data latch 58 stores the data to be written into the flash memory 45 in response to the data read pulse DR output from the one-shot pulse generator 57.

During the data write into the flash memory 45, the controller 53 in the flash controller 43 supplies the OR gate 54 with the busy signal BS so that the OR gate 54 outputs the gate control signal G of the H level.

Accordingly, the AND gate 44 blocks the clock signal to be supplied from the clock generator 34 to the CPU 42, thereby suspending the operation of the CPU 42 as illustrated in FIG. 6(j).

In this way, the data is written into the flash memory 45. With the completion of the data write, the controller 53 in the flash controller 43 suspends the busy signal BS. Hence, the OR gate 54 supplies the AND gate 44 with the gate control signal G of the low level, thereby restarting the operation of the CPU 42 as illustrated in FIG. 6.

Then, the CPU 42 transmits a verification command (COH, for example) to the command register 52 in the flash controller 43 to make a decision whether or not the data is written correctly into the flash memory 45 at step ST24.

Receiving the verification command from the command register 52, the controller 53 in the flash controller 43 supplies the OR gate 54 with the verification signal VS of the H level, which is output therefrom as the gate control signal G of the H level.

Thus, the AND gate 44 blocks the clock signal to be supplied from the clock generator 34 to the CPU 42, thereby suspending the operation of the CPU 42 again as illustrated in FIG. 6(j).

Then, the controller 53 in the flash controller 43 establishes the verification condition by increasing the voltages of the sense amplifier and decoder from their normal voltages as shown in FIG. 6(i).

These voltages are increased in the verification process to ensure that the data is written securely by confirming whether the data can be read correctly under the more strict conditions than usual.

When the verification condition has been established, the controller 53 in the flash controller 43 supplies the one-shot pulse generator 55 with the verification pulse VP which indicates the establishment by falling from the H to L level. In response to this, the one-shot pulse generator 55 supplies the verification read latch 56 with the verification read pulse VR instructing it to read the data from the flash memory 45. Thus, the verification read latch 56 reads the data from the flash memory 45 at step ST25.

When the verification read latch 56 stores the data read from the flash memory 45, the comparator 59 compares the data with the data stored in the data latch 58 at the data write, and supplies the compared result to the bus.

When the comparator 59 completes the comparing, the controller 53 in the flash controller 43 starts to release the verification condition. After completing the release of the verification condition, the controller 53 in the flash controller 43 supplies the OR gate 54 with the verification signal VS of the L level. Thus, the OR gate 54 outputs the gate control signal G of the L level, and the AND gate 44 releases the block of the clock signal, thereby restarting its supply to the CPU 42 to restart it as illustrated in FIG. 6(j).

Restarting its operation, the CPU 42 reads the compared result from the bus, makes a decision whether the data has been written correctly at step ST26, and proceeds to step ST27 if the decision result is positive. Otherwise, it returns to step ST22 to iterate writing data.

As described above, the present embodiment 5 prevents, when the CPU 42 outputs the verification command, the clock signal from being supplied to the CPU 42, establishes the verification condition, and compares the data read from the flash memory 45 with the expected value; and then restarts, when the comparison has been completed, to supply the clock signal to the CPU 42. This makes it unnecessary for the CPU 42 to read the data from the flash memory 45 when the verification condition is established. As a result, even if the flash memory 45 stores the program to be executed by the CPU 42, it is not necessary to transfer the program from the flash memory 45 to the RAM 41 to achieve the verification.

Embodiment 6

Although the verification is carried out on the data written into the flash memory 45 in the foregoing embodiment 5, it can be carried out with the data left in the flash memory 45 after its erasure, achieving a similar same effect to that in the embodiment 5.

Specifically, the CPU 42 supplies the command register 52 in the flash controller 43 with a command instructing the controller 53 to erase data in the flash memory 45 in place of the command instructing it to write data thereinto, so that the data is erased.

The verification of the data erasure is carried out as in the embodiment 5 by comparing the data read from the flash memory 45 and stored in the verification read latch 56 with the data stored in the data latch 58 in advance, which is "FFH", for example.

Embodiment 7

Although the verification is carried out on the data written in the flash memory 45 in the foregoing embodiment 5, it can be performed on the data written into the flash memory 45 by auto-erasure. In this case, the verification can be achieved by confirming whether the data read out of the flash memory 45 all agree with each other, and by making a decision that the data are written correctly by the auto-erasure if they agree entirely. Thus, the present embodiment 7 can achieve the effect similar to that of the embodiment 5.

Embodiment 8

Although the verification is carried out on the data left in the flash memory 45 after its erasure in the foregoing embodiment 6, it can be performed on the data left in the flash memory 45 after its auto-erasure. In this case, the verification can be achieved by confirming whether the data read out of the flash memory 45 all agree with each other, and by making a decision that the data are erased correctly by the auto-erasure if they agree entirely. Thus, the present embodiment 8 can achieve the effect similar to that of the embodiment 6.

Embodiment 9

Although not referred to in the foregoing embodiments 1–8, the flash controller 43 counts the verification period using an embedded timer not shown in the drawings. However, the monitor timer 36 can count the verification period in place of the flash controller 43.

Figure 9:
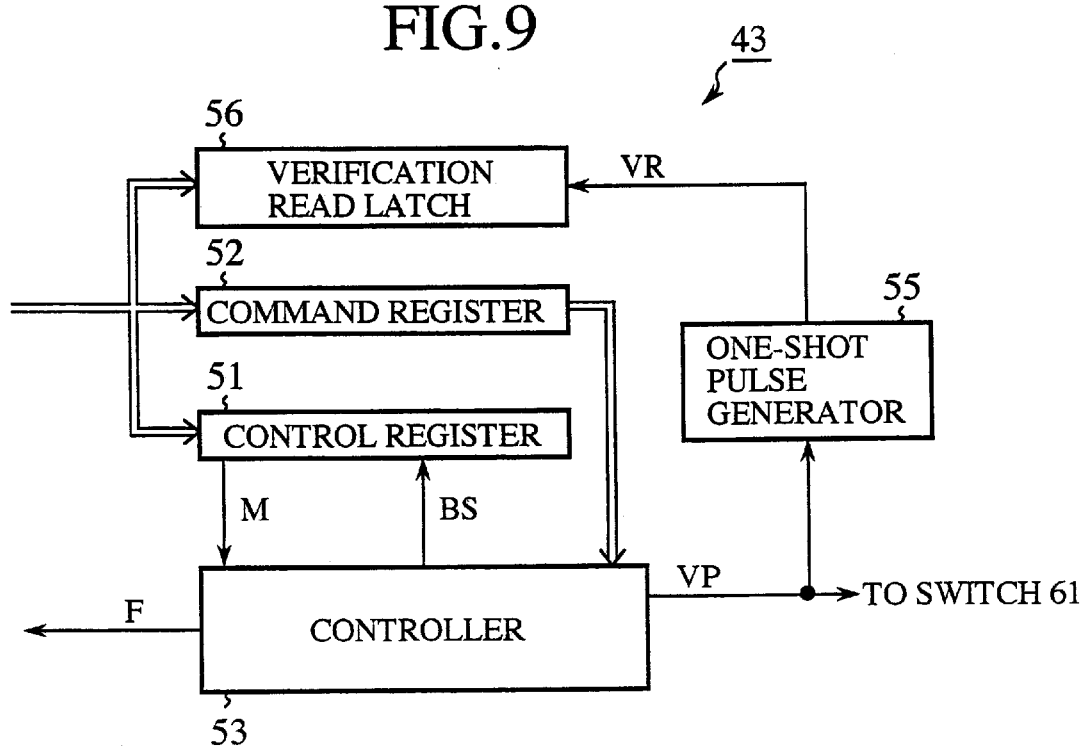
FIG. 9 is a block diagram showing the detail of the flash controller 43 of the embodiment 9.
Figure 8:
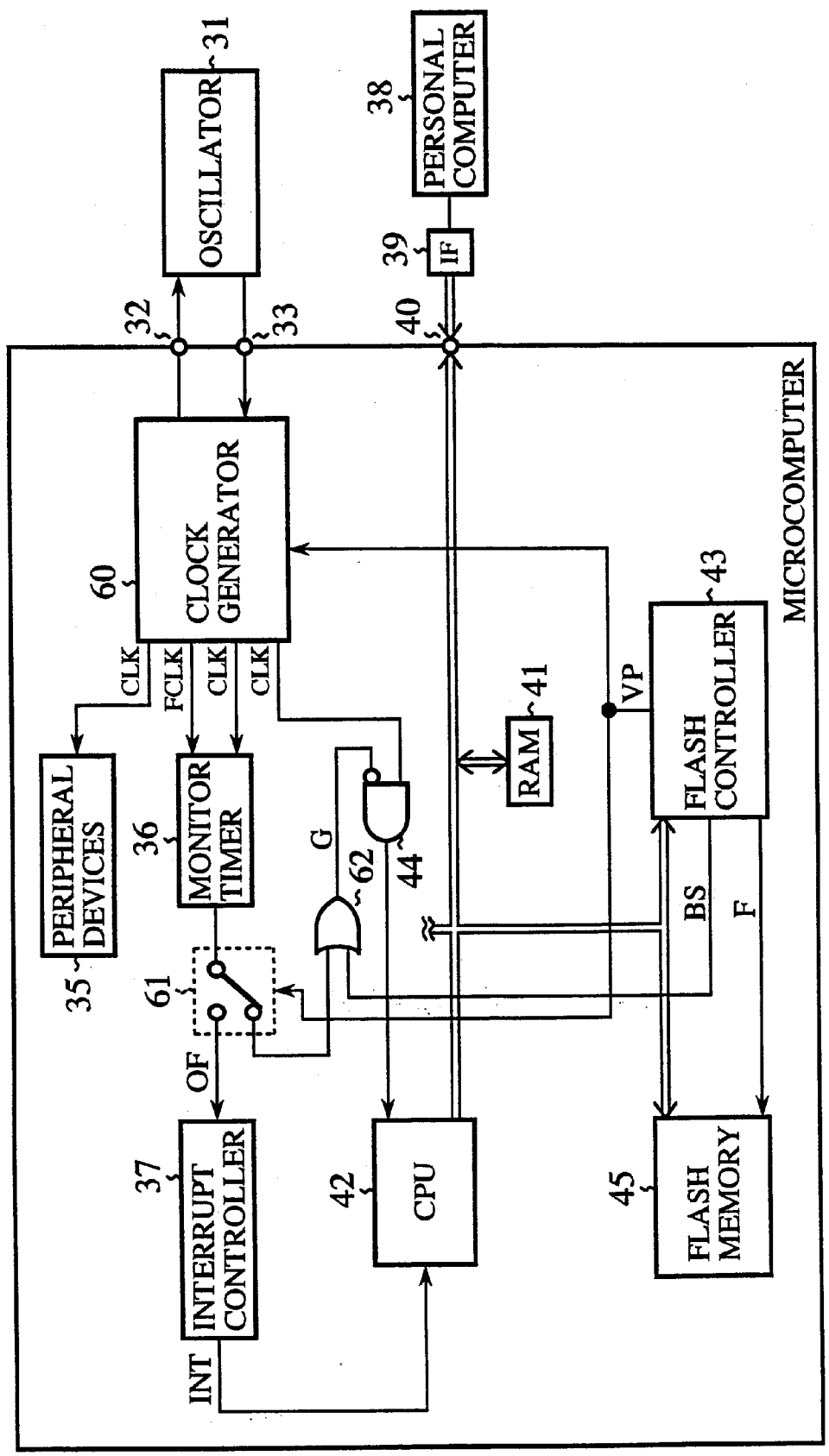
FIG. 8 is a block diagram showing an embodiment 9 of the microcomputer in accordance with the present invention.
Figure 11:
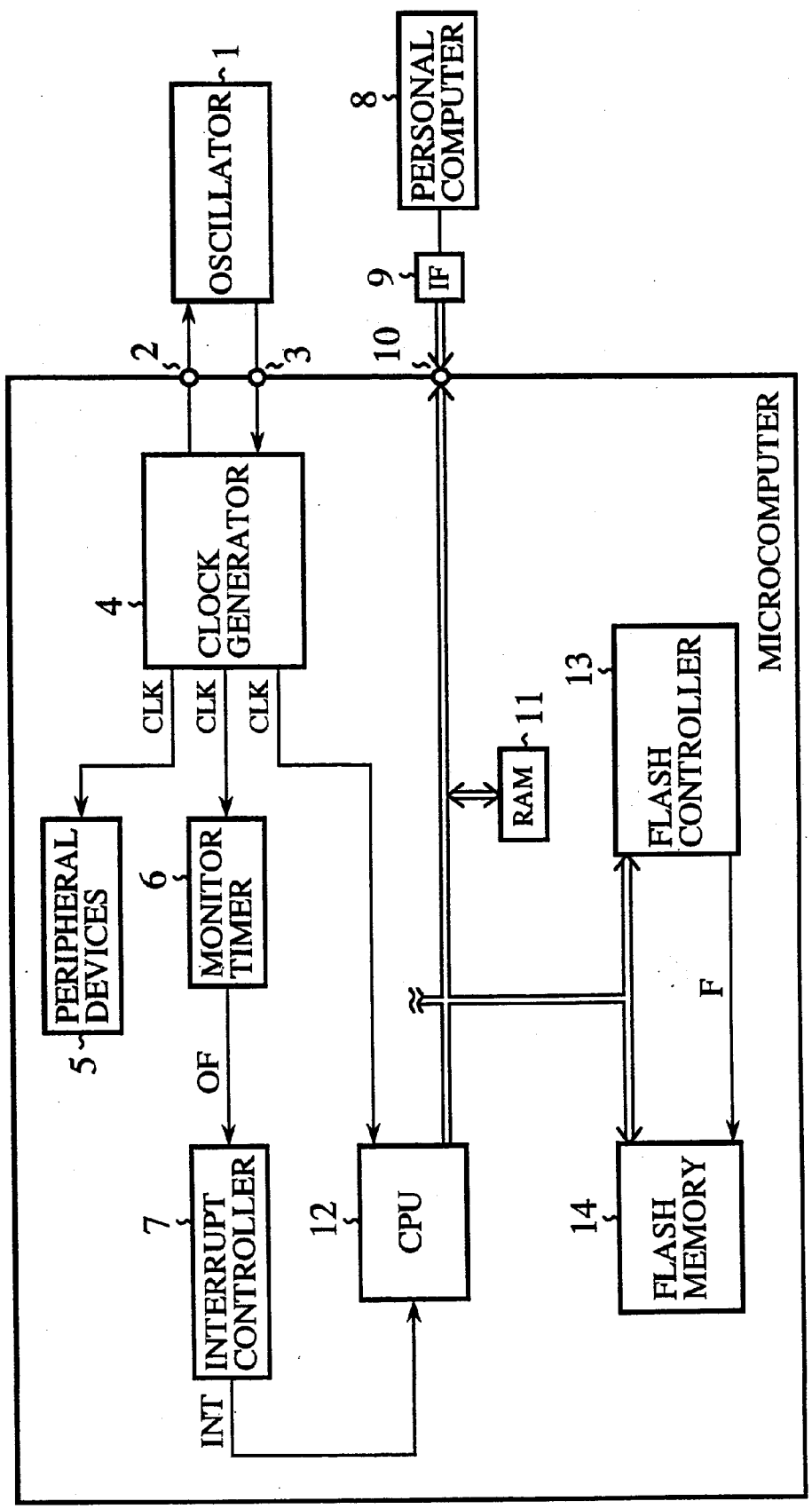
FIG. 11 is a block diagram showing a conventional microcomputer.
Figure 12:
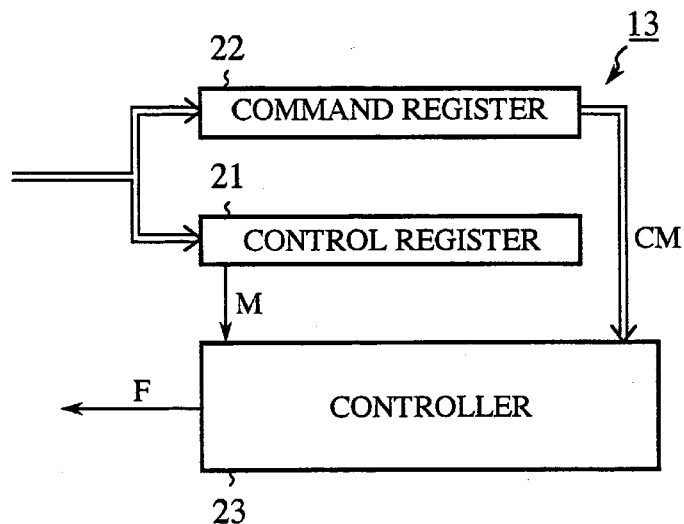
FIG. 12 is a block diagram showing the detail of a flash controller 13 of the conventional microcomputer.
Figure 14:
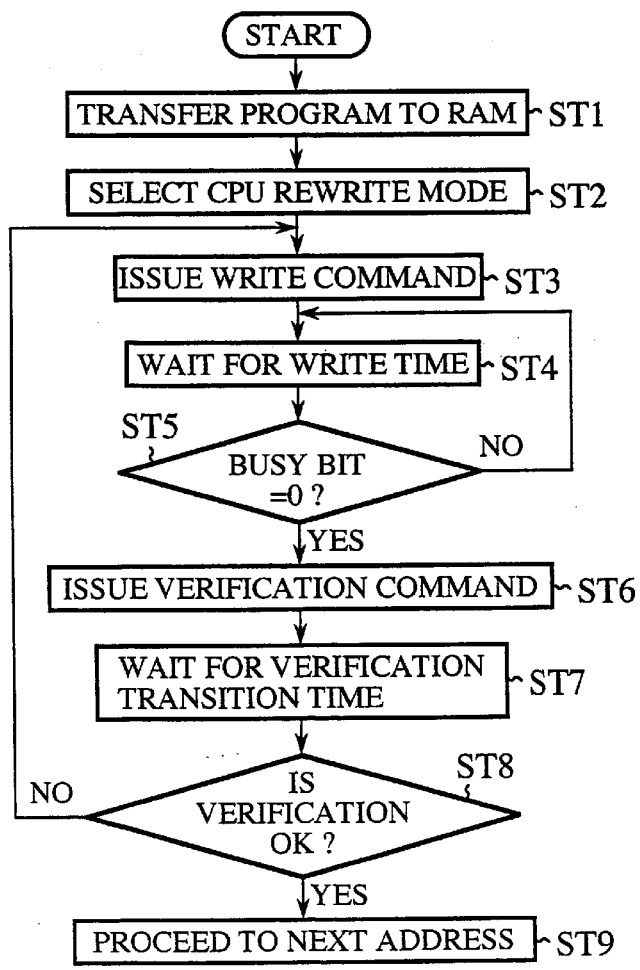
FIG. 14 is a flowchart illustrating the operation of the conventional microcomputer.

FIG. 8 is a block diagram showing a configuration of such an embodiment 9 of the microcomputer in accordance with the present invention, and FIG. 9 is a block diagram showing the detail of the flash controller 43. In these figures, the same reference numerals designate the same or like portions to those of FIG. 1, and the description thereof is omitted here.

In FIG. 8, the reference numeral 60 designates a clock generator that generates the clock signal CLK to be supplied to the CPU 42, and produces a clock signal FCLK by altering the pulse rate of the clock signal CLK when the flash controller 43 outputs the verification pulse VP. The reference numeral 61 designates a switch (clock management means) for changing the connection of the monitor timer 36 from the interrupt controller 37 to an OR gate 62 when the flash controller 43 outputs the verification pulse VP. The OR gate 62 supplies, when the monitor timer 36 or flash controller 43 outputs an H level signal, the AND gate 44 with the gate control signal G of the H level indicative of suspending the supply of the clock signal to the CPU 42.

Next, the operation of the present embodiment 9 will be described with reference to the timing charts of FIGS. 10(a)–10(h).

When the flash controller 43 produces the verification pulse VP indicative of starting processing for establishing the verification condition by rising from the L to H level, the clock generator 60 alters the pulse rate of the clock signal CLK to generate the clock signal FCLK suitable for counting the verification period. At the same time, the switch 61 changes the connection of the monitor timer 36 from the interrupt controller 37 to the OR gate 62.

Thus, the monitor timer 36 continues to output the H level signal during the verification period, with producing an overflow signal by changing its output level from the H to L level when the count value reaches the set value, which means that the verification period is over. Hence, the OR gate 62 continues to output the gate control signal G of the H level during the verification period, and the AND gate 44 blocks the clock signal to be supplied from the clock generator 34 to the CPU 42, thereby suspending the operation of the CPU 42 as shown in FIG. 10(e).

When the verification period is over, the monitor timer 36 produces the L level signal, and the OR gate 62 outputs the gate control signal G of the L level. Accordingly, the AND gate 44 releases the block of the clock signal CLK to restart the supply of the clock signal to the CPU 42. Thus, the CPU 42 restarts its operation as illustrated in FIG. 10(e).

During writing or erasing data to or from the flash memory 45, the flash controller 43 supplies the OR gate 62 with the busy signal BS of the H level. In this case also, the OR gate 62 outputs the gate control signal G of the H level, and the AND gate 44 prevents the clock signal from being supplied from the clock generator 34 to the CPU 42, thereby suspending its operation.

According to the present embodiment 9, since the monitor timer 36 counts the verification period, it becomes unnecessary for the flash controller 43 to include the timer for counting it, which enables the microcomputer to be reduced in its size by that amount. In addition, since the present embodiment is provided with the monitor timer that produces the overflow signal, it has an advantage of being able to return the CPU to a normal operation, even if the CPU runs away during executing the verification. Besides, since the pulse rate of the clock signal is varied when the verification command is transferred from the CPU 42, the monitor timer 36 can be utilized as a timer for measuring the verification period.

Embodiment 10

Although the foregoing embodiment 9 changes the pulse rate of the clock signal generated by the clock generator 60, the set value of the monitor timer 36 can be changed instead, achieving the same effect as that of the embodiment 9. Besides, since the set value of the monitor timer 36 is varied when the verification command is transferred from the CPU 42, the monitor timer 36 can be utilized as a timer for measuring the verification period.

What is claimed is:

1. A microcomputer comprising:
    a flash memory;
    a clock generator for generating a clock signal;
    a central processing unit (CPU) for transmitting a verification command when carrying out verification of data in said flash memory while executing a program in response to the clock signal generated by said clock generator;
    condition establishing means for establishing, when it receives the verification command from said CPU, a verification condition and suspending supply of the clock signal to said CPU;
    data read means for reading data from said flash memory when said condition establishing means establishes the verification condition;
    comparing means for comparing the data read from said flash memory with an expected value; and
    condition releasing means for releasing said verification condition to restart the supply of the clock sign to said CPU.

2. The microcomputer as claimed in claim 1, wherein said data to be subjected to the verification is data written into said flash memory.

3. The microcomputer as claimed in claim 1, wherein said data to be subjected to the verification is data left in said flash memory after erasure of said flash memory.

4. The microcomputer as claimed in claim 2, wherein said data read means comprises a register for storing the data read from said flash memory, and said comparing means consists of said CPU that restarts its operation and compares the data in said register with the expected value after said condition releasing means releases said verification condition.

5. The microcomputer as claimed in claim 3, wherein said data read means comprises a register for storing the data read from said flash memory, and said comparing means consists of said CPU that restarts its operation and compares the data in said register with the expected value after said condition releasing means releases said verification condition.

6. The microcomputer as claimed in claim 2, wherein said comparing means compares the data read by said data read means with the expected value when the verification condition is established, and said condition releasing means releases the verification condition when said comparing means outputs a compared result.

7. The microcomputer as claimed in claim 3, wherein said comparing means compares the data read by said data read means with the expected value when the verification condition is established, and said condition releasing means releases the verification condition when said comparing means outputs a compared result.

8. The microcomputer as claimed in claim 1, further comprising a monitor timer for starting, when said CPU transmits the verification command, counting of a clock signal generated by said clock generator, and for producing an overflow signal when its count value reaches a set value without being reset.

9. The microcomputer as claimed in claim 8, further comprising clock management means for resetting, when said CPU transmits the verification command, the count value of said monitor timer, for supplying said condition establishing means with a command to suspend supply of said clock signal to said CPU, and for supplying said condition releasing means with a command to restart the supply of the clock signal to said CPU when said monitor timer produces the overflow signal.

10. The microcomputer as claimed in claim 9, wherein said clock management means changes at least one of a pulse rate of said clock signal and the set value of said monitor timer when said CPU transmits the verification command.

11. A microcomputer comprising:

a flash memory;

a clock generator for generating a clock signal;

a central processing unit (CPU) for transmitting a verification command when carrying out, while executing a program in response to the clock signal generated by said clock generator, verification of data in said flash memory generated by auto-erasure;

condition establishing means for establishing, when it receives the verification command from said CPU, a verification condition and for suspending supply of the clock signal to said CPU;

data read means for reading data from said flash memory when said condition establishing means establishes the verification condition;

decision means for making a decision whether the data read from said flash memory all agree with each other; and condition releasing means for releasing said verification condition to restart the supply of the clock sign to said CPU.

12. The microcomputer as claimed in claim 11, wherein said data to be subjected to the verification are data written into said flash memory by the auto-erasure.

13. The microcomputer as claimed in claim 11, wherein said data to be subjected to the verification are data left in said flash memory after erasure of said flash memory by the auto-erasure.

14. The microcomputer as claimed in claim 12, wherein said decision means consists of said CPU that restarts its operation and makes a decision whether the data read by said data read means entirely agree with each other after said condition releasing means releases said verification condition.

15. The microcomputer as claimed in claim 13, wherein said decision means consists of said CPU that restarts its operation and makes a decision whether the data read by said data read means entirely agree with each other after said condition releasing means releases said verification condition.

16. The microcomputer as claimed in claim 12, wherein said decision means makes a decision, when the verification condition is established, whether the data read by said data read means entirely agree with each other, and said condition releasing means releases the verification condition when said decision means outputs a decision result.

17. The microcomputer as claimed in claim 13, wherein said decision means makes a decision, when the verification condition is established, whether the data read by said data read means entirely agree with each other, and said condition releasing means releases the verification condition when said decision means outputs a decision result.

18. The microcomputer as claimed in claim 11, further comprising a monitor timer for starting, when said CPU transmits the verification command, counting of a clock signal generated by said clock generator, and for producing an overflow signal when its count value reaches a set value without being reset.

19. The microcomputer as claimed in claim 18, further comprising clock management means for resetting, when said CPU transmits the verification command, the count value of said monitor timer, for supplying said condition establishing means with a command to suspend supply of said clock signal to said CPU, and for supplying said condition releasing means with a command to restart the supply of the clock signal to said CPU when said monitor timer produces the overflow signal.

20. The microcomputer as claimed in claim 19, wherein said clock management means changes at least one of a pulse rate of said clock signal and the set value of said monitor timer when said CPU transmits the verification command.

21. A method of data verification comprising the steps of:

transmitting a verification command from a central processing unit (CPU) to a flash controller;

establishing a verification condition, upon receipt of the verification command, and suspending the supply of a clock signal to the CPU;

reading data from a flash memory under the verification condition;

comparing data read from flash memory with an expected value; and releasing the verification condition, including restarting the supply of the clock signal to the CPU.

22. The method of claim 21, wherein the step of establishing a verification condition further comprises the step of creating a stricter data read condition.

23. The method of claim 21, wherein the step of establishing a verification condition further comprises the step of increasing the voltages of a sense amplifier and decoder.

* * * * *

UNITED STATES PATENT AND TRADEMARK OFFICE
CERTIFICATE OF CORRECTION

PATENT NO.    : 6,212,646 B1
DATED         : April 3, 2001
INVENTOR(S)   : Y. Miwa et al.

It is certified that error appears in the above-identified patent and that said Letters Patent is hereby corrected as shown below:

Claim 1,
Line 11, -- for -- is inserted after "and".
Line 19, "clock sign" is changed to -- clock signal --.

Claim 11,
Line 20, "clock sign" is changed to -- clock signal --.

Signed and Sealed this

Twelfth Day of March, 2002

Attest:

JAMES E. ROGAN
Attesting Officer         Director of the United States Patent and Trademark Office